United States Patent [19]

Hopkins

[11] Patent Number: 5,454,018

[45] Date of Patent: Sep. 26, 1995

[54] COUNTER CIRCUIT WITH AUTOMATIC RESET

[75] Inventor: Thomas L. R. Hopkins, Cary, Ill.

[73] Assignee: SGS-Thomson Microelectronics, Inc., Carrollton, Tex.

[21] Appl. No.: 176,345

[22] Filed: Dec. 30, 1993

[51] Int. Cl.[6] .................... H03K 21/38; H03K 21/40
[52] U.S. Cl. .................... 377/28; 377/107; 377/124
[58] Field of Search .................. 377/28, 72, 107, 377/122, 124

[56] References Cited

U.S. PATENT DOCUMENTS

| 3,051,855 | 8/1962 | Lee | 377/122 |
| 3,530,284 | 9/1970 | Wood | 377/28 |
| 3,555,249 | 1/1971 | Ahrons | 377/28 |
| 3,613,014 | 10/1971 | Moegen | 377/124 |
| 3,639,740 | 2/1972 | Escoffier et al. | 377/124 |
| 4,646,332 | 2/1987 | Sajor et al. | 377/124 |

Primary Examiner—John S. Heyman
Attorney, Agent, or Firm—Kenneth C. Hill; Lisa K. Jorgenson; Richard K. Robinson

[57] ABSTRACT

A ring counter includes a plurality of latches forming a shift register. A single bit is sequentially clocked through the shift register, so that only one output is active at any time. A logic circuit is connected to the outputs, and monitors the number of outputs which are active. If more than one output should somehow become active at one time, such as during power up, a reset signal is immediately generated to reset a single bit of the counter active. An external reset signal can also be applied to the logic circuit to force a reset of the counter.

14 Claims, 1 Drawing Sheet

COUNTER CIRCUIT WITH AUTOMATIC RESET

BACKGROUND OF THE INVENTION

1. Field of the Invention

The present invention relates to the field of microelectronics, and in particular to digital circuits. Still more particularly, the present invention relates to digital counters.

2. Description of the Prior Art

In digital circuit designs, digital counter circuits are often used to control the timing and/or sequencing of operations which occur in other portions of an overall circuit design. In many circuit designs, it is desirable to use a digital counter circuit having N-number of outputs, wherein only one of the N outputs is active at any instance. Since the outputs of the counter may be used to control operations in other portions of the circuit, and such operations may not be able to occur at the same time, it may be critical that no more than one output of the counter is active at any time, and that no false states occur during transitions, including the period during power-up.

One such counter circuit is implemented by clocking a single bit through a series of sequentially connected latches connected in a shift register configuration. This type of counter may be referred to as a "ring counter", and is sometimes referred to as a shift register counter. One advantage of the ring counter is that decoding logic is not required to determine which one of the N outputs should be active during a particular clock cycle. If decoding logic is used to activate one of the N outputs, as in a "Johnson counter," glitches may be generated as the decode logic settles and reaches a final state, thereby causing glitches on the output, where more than one output is active at a particular instance.

Although ring counters have the advantages mentioned above, ring counters also have disadvantages. One disadvantage is the possibility that the shift register chain may enter into an improper state. An improper state occurs in a ring counter when more than one active bit enters the shift register chain, which causes more than one output to be active. If, for example, during power-up, the counter does not reset properly, such an improper state may occur. In other cases, such as transitory conditions caused by power supply transients, an improper state can occur. Moreover, once a ring counter has entered into an improper state, such an improper state will continue until a reset signal is received, which will clear all but one active output.

Therefore, it would be desirable to have an apparatus to prevent a ring counter from outputting an improper state in the form of having more than one output in the active state at a particular instance.

SUMMARY OF THE INVENTION

A ring counter according to the present invention includes a plurality of latches forming a shift register. A single bit is sequentially clocked through the shift register, so that only one output is active at any time. A logic circuit is connected to the outputs, and monitors the number of outputs which are active. If more than one output should somehow become active at one time, such as during power up, a reset signal is immediately generated to reset a single bit of the counter active. An external reset signal can also be applied to the logic circuit to force a reset of the counter.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing, wherein:

DESCRIPTION OF THE PREFERRED EMBODIMENT

Figure 1:
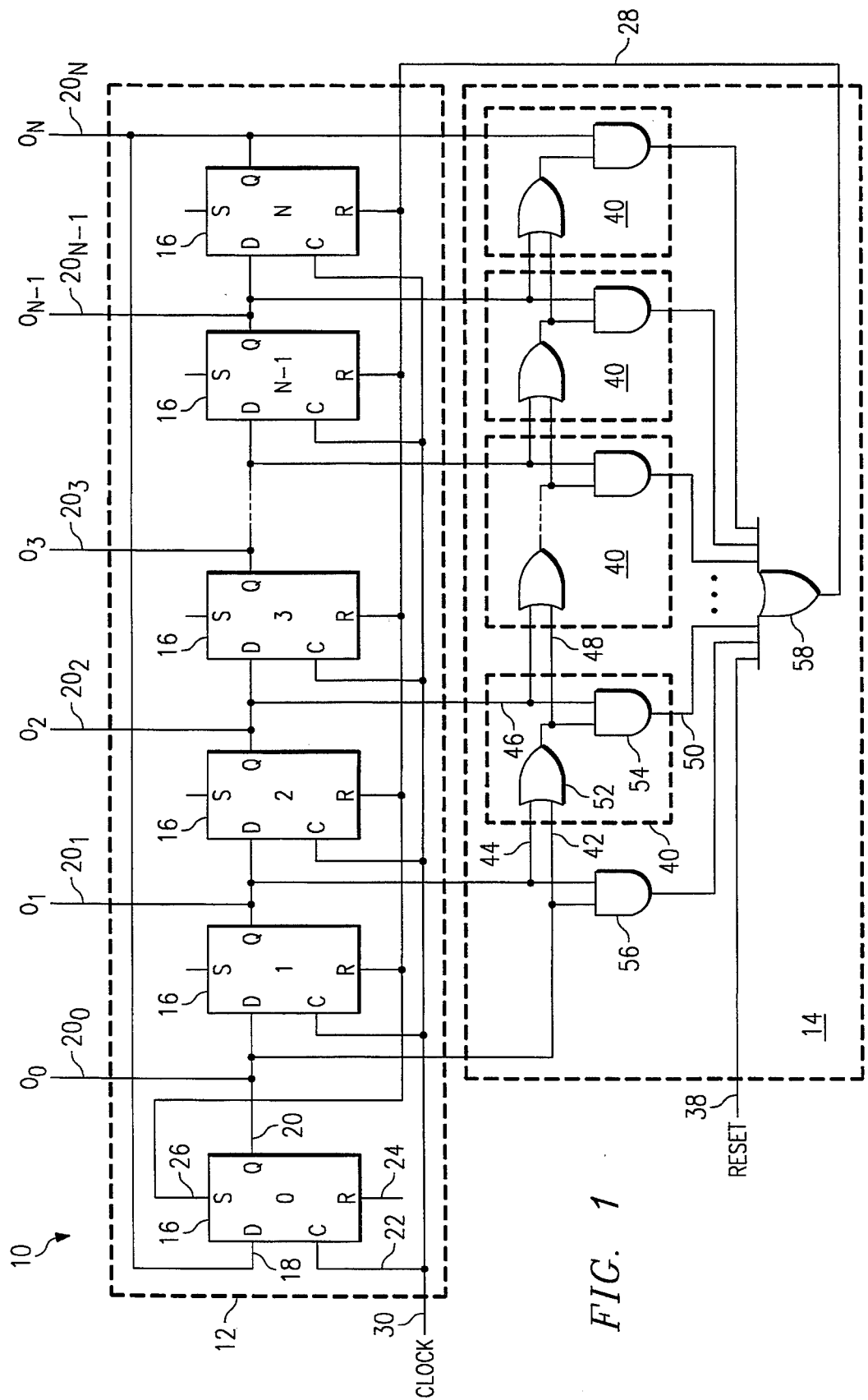
FIG. 1 is a schematic diagram of a digital counter in accordance with a preferred embodiment of the present invention.

Referring now to FIG. 1, a schematic diagram of a digital counter 10 is depicted in accordance with a preferred embodiment of the present invention. Digital counter 10 includes a shift register portion 12 and a reset signal portion 14.

Shift register portion 12 includes a series of N latch circuits 16, each having an input 18, an output 20, a clock input 22, a "reset" input 24, and a "set" input 26. Each latch circuit 16 is preferably a D flip-flop. As illustrated, the series of N latch circuits 16 are connected in a configuration that one skilled in the art may recognize as a "ring counter," wherein each output 20 is connected to an input 18 of a subsequent latch circuit 16 in the series of latch circuits, except for the last, or Nth, latch circuit 16. The output 20 of the last latch circuit is connected to the input 18 of the first latch circuit 16. Each output 20 of each of latch circuit 16 is also connected to a counter output $20_O$ through $20_N$. As mentioned previously, counter outputs $20_O$ through $20_N$ may be used to control the sequencing or timing of other operations in other portions of an overall digital circuit design.

Each reset input 24 of each latch circuit 16 is connected to a reset signal line 28, except for the first latch circuit 16, which has reset signal line 28 connected to the set input 26. When a reset signal is received by shift register portion 12 on signal line 28, each latch circuit 16 is set to a first state (i.e., set to a "zero" state), except for the first latch circuit 16, which is set to a second state or active state (i.e., set to a "one" state). In this example, an output of a "one" is considered "active." However, those persons skilled in the art will recognize that either a "one" or a "zero" may be considered an active output or signal, depending upon the specific circuit design. The reset input 24 for the first latch 16, and the set inputs 26 for the remaining latches, are preferably connected to a zero or one value, whichever will force them to be permanently inactive.

Each clock input 22 of each latch circuit 16 is connected to a clock signal line 30. When a clock signal is received by shift register portion 12 on signal line 30, data bits stored in one latch circuit 16 are clocked to a subsequent latch circuit 16. After receiving a successful reset signal 28, and upon periodically receiving clock signal 30, shift register portion 12 will, during normal operation, cycle a single data bit, which is in the second state (i.e., a "one"), through all N latch circuits, thereby causing a single active signal to appear on one of the outputs, $20_O$ through $20_N$.

Turning now to reset signal portion 14 of digital counter 10, there is depicted a circuit which generates reset signal 28. Reset signal 28 is generated upon the occurrence of an improper state within shift register portion 12, or upon receiving a signal from external reset signal line 38.

Reset signal portion 14 includes a series of N-2 logic cells 40, one of which is associated with each of the last N-2 latch circuits 16 in the series of N latch circuits 16. Each logic cell 40 has three inputs, and two outputs. The three inputs to each logic cell 40 include: input 42, input 44, and input 46. The two outputs from each logic cell 40 include: output 48 and output 50.

In the implementation shown in FIG. 1, logic cell 40 comprises a two-input OR-gate 52 and a two-input AND-gate 54. One input to OR-gate 52 is connected to logic cell input 42 and the other input to OR-gate 52 is connected to logic cell input 44. The output of OR-gate 52 is connected to one input of AND-gate 54 and logic cell output 48. The other input of AND-gate 54 is connected to logic cell input 46. The output of AND-gate 54 is connected to logic cell output 50.

While the implementation of logic cell 40 is illustrated here using AND- and OR-gates, those persons skilled in the art will recognize that the circuits used to implement logic cell 40 may be different, yet perform the same logical function. For example, a De Morgan equivalent circuit may be used to implement the function of logic cell 40. Since logic cell 40 will be replicated N-2 times, integrated circuit designers may want to consider the area required to fabricate the circuit of logic cell 40.

Input 42 of a particular logic cell 40 receives a signal that indicates at least one of the outputs 20 of a previous latch circuit 16 is active (high). This applies only to latches at least two prior to the associated latch, and does not include the immediately preceeding latch. For example, an active signal received at input 42 of the logic cell 40 associated with latch circuit (3) 16 indicates that output 20 of either or both latch circuit (1) 16 or latch circuit (0) 16 is active. The input 42 of the logic cell 40 associated with latch circuit (7) would similarly indicate whether any of the outputs from latches (0) through (5) were active. Input 42 is connected to output 48 from the immediately preceeding logic cell 40, except for the first logic cell 40, which is discussed below.

Input 44 of a particular logic cell 40 is used to indicate whether or not output 20 of the latch circuit 16 immediately prior to a latch circuit 16 associated with the particular logic cell 40 is active. For example, an active signal received at input 44 of the logic cell 40 associated with latch circuit (3) 16 indicates that output 20 of latch circuit (2) 16, which is the prior latch circuit 16, is active.

Input 46 of a particular logic cell 40 is used to indicate whether or not output 20 of the latch circuit 16 associated with the particular logic cell 40 is active. For example, an active signal received at input 46 of the logic cell 40 associated with latch circuit (3) 16 indicates that output 20 of latch circuit (3) 16 is active.

Output 48 of a particular logic cell 40 is used to indicate whether or not output 20 of any latch circuit 16 prior to the latch circuit 16 associated with the particular logic cell 40 is active. Output 50 produces an active signal if one of the outputs 20 of any previous latch circuit 16 is active, and the output 20 of an associated latch circuit 16 is active. Output 50 active thus indicates that at least two outputs are simultaneously active, by definition an error condition.

AND-gate 56 is used to monitor the outputs 20 of the first two latch circuits 16. AND-gate 56 produces an active signal if the outputs 20 of the first two latch circuits 16 are both active.

Finally, the N inputs to OR-gate 58 are connected to N-2 logic cells 40, the output of AND-gate 56, and external reset 38. If any one of such inputs is active, OR-gate 58 activates reset signal 28, which resets each latch circuit 16 to a first state (i.e., a "zero" state), except for the first latch circuit 16, which is set to a second state (i.e., a "one" state). Thus, if any one of the inputs to AND-gate 56, except external reset 38, is active, an improper state exists within digital counter 10, which is then immediately cleared by the generation of reset signal 28.

While the invention has been particularly shown and described with reference to a preferred embodiment, it will be understood by those skilled in the art that various changes in form and detail may be made therein without departing from the spirit and scope of the invention.

What is claimed is:

1. A digital counter circuit, comprising:

a clock signal input;

a reset signal input;

a shift register having a plurality of outputs, a clock input, and a reset input, wherein the shift register is configured as a ring counter, and wherein an active signal presented to the reset input causes a single output to be set to a second state while all remaining outputs are set to a first state; and a logic circuit having N inputs connected to the N outputs of the N-bit shift register for immediately producing a reset signal upon the occurrence of any two or more of the N outputs being simultaneously in the second state, wherein the reset signal is connected to the shift register reset input.

2. The counter circuit of claim 1, wherein the shift register comprises N latches connected to form a ring counter.

3. The counter circuit of claim 2, wherein each of the N latches comprises a D flip-flop.

4. The counter circuit of claim 1, wherein the logic circuit comprises a plurality of identical cells, each generating an output which is connected to a combination logic gate for generating the reset signal.

5. The counter circuit of claim 4, wherein the combination logic gate is an OR gate having an output connected to the shift register reset input.

6. The counter circuit of claim 4, wherein the shift register has N latches generating N outputs, and wherein the plurality of cells comprises N-2 cells corresponding to N-2 latches of the shift register, and further comprising an extra logic gate corresponding to one of the remaining two latches of the shift register.

7. The counter circuit of claim 6, wherein each of the cells contains logic gates having inputs connected to outputs of the associated latch and a latch immediately preceding the associated latch, and outputs connected to the combination logic gate and to an input of the cell for an immediately following cell, except for a last cell which has only a single output connected to the combination logic gate, and for a first cell, which is associated with a third latch and has an input connected to an output of a first latch.

8. The counter circuit of claim 7, wherein each cell comprises an OR gate having inputs connected to an output of the preceding cell and to the output of the immediately preceding latch, and an AND gate having inputs connected to the output of the associated latch and to an output of the OR gate of the cell, wherein an output of the AND gate is connected to the combination logic gate.

9. The counter circuit of claim 4, further comprising an external reset input connected to an input of the combination logic gate, wherein an active signal on the external reset input will cause the combination logic gate will generate a reset signal.

10. The counter circuit of claim 1, further comprising an external reset input connected to the logic circuit, wherein a preselected state on the external reset input will cause the logic circuit to generate the reset signal.

11. A method for resetting a shift register counter, comprising the steps of:

clocking an active bit sequentially through the shift register;

monitoring all of the shift register outputs;

if more than one of the shift register outputs are simultaneously active, immediately generating a reset signal; and in response to the reset signal, immediately resetting the shift register to a known state having exactly one active bit.

12. The method of claim 11, further comprising the step of:

in response to an externally generated reset signal, generating the reset signal.

13. The method of claim 11, wherein the monitoring step comprises the steps of:

within a logic circuit, sensing output values for all outputs of the shift register; and immediately generating the reset signal when more than one of the output values are simultaneously active.

14. A digital counter circuit, comprising:

a series of N sequentially connected latch circuits, each of the N latch circuits having an input, an output, a clock input, a set input, and a reset input, and wherein each of the N latch circuit inputs is connected to the output of a preceding latch circuit;

a clock signal connected to each clock input of each of the N sequentially connected latch circuits;

an external reset signal;

a reset signal connected to each reset input of each of the N sequentially connected latch circuits, except for one selected latch circuit having the reset signal connected to the set input;

a series of N-2 sequentially connected OR-gates, each having two inputs and an output, wherein one of the inputs of each OR-gate is connected to the output of a preceding OR-gate, and the other input of each OR-gate is connected to the output of one of the series of sequentially connected latch circuits, except for a first OR-gate in the series of N-2 sequentially connected OR-gates in which is connected to two outputs of two sequential latches in the series of N sequentially connected latch circuits;

a series of N-1 AND-gates, each having two inputs and an output, wherein one of the inputs of each AND-gate is connected to the output of a preceding OR-gate, and the other input is connected to the output of one of the series of N sequentially connected latch circuits, except for a first AND-gate in the series of N-1 sequentially connected AND-gates in which the two inputs are separately connected to two outputs of two sequential latches in the series of N sequentially connected latch circuits; and an N-input OR-gate for producing the reset signal, wherein each of N-1 inputs is connected to an output of one of the series of N-1 AND-gates and the remaining input is connected to the external reset signal.

* * * * *